(12) United States Patent
Masuda et al.

(10) Patent No.: US 6,524,700 B2
(45) Date of Patent: Feb. 25, 2003

(54) PRESSURE SENSITIVE ADHESIVE SHEET FOR WAFER STICKING

(75) Inventors: Yasushi Masuda, Nishiki-machi (JP); Hideki Numazawa, Urawa (JP); Osamu Yamazaki, Urawa (JP)

(73) Assignees: NEC Corporation, Tokyo (JP); Lintec Corporation, Tokyo (JP)

(*) Notice: Subject to any disclaimer, the term of this patent is extended or adjusted under 35 U.S.C. 154(b) by 80 days.

(21) Appl. No.: 09/788,112

(22) Filed: Feb. 16, 2001

(65) Prior Publication Data
US 2001/0019766 A1 Sep. 6, 2001

(30) Foreign Application Priority Data

Feb. 18, 2000 (JP) ........................................ 2000-040873

(51) Int. Cl.[7] ............................ B32B 15/04; B32B 7/12; C09J 7/02
(52) U.S. Cl. ................ 428/343; 428/345; 428/355 AC; 428/901
(58) Field of Search ................................ 428/343, 345, 428/355 AC, 901

(56) References Cited

U.S. PATENT DOCUMENTS 4,999,242 A * 3/1991 Ishiwata et al. ............. 428/345
5,714,029 A 2/1998 Uemura et al.

FOREIGN PATENT DOCUMENTS

| EP | 0 134 606 A2 | 3/1985 |
| EP | 0 157 508 A2 | 10/1985 |
| EP | 0 999 250 A2 | 5/2000 |
| GB | 2221470 A | 2/1990 |
| GB | 2340772 A | 3/2000 |
| JP | 60196956 | 10/1985 |
| JP | 60-223139 | 11/1985 |
| JP | 63-043988 | 2/1988 |
| JP | 60-61346 | 3/1994 |

* cited by examiner

Primary Examiner—Daniel Zirker
Assistant Examiner—Victor S. Chang
(74) Attorney, Agent, or Firm—Webb Ziesenheim Logsdon Orkin & Hanson, P.C.

(57) ABSTRACT

A pressure sensitive adhesive sheet for wafer sticking, comprising a base of polyvinyl chloride containing a plasticizer and, superimposed thereon, an energy radiation curable pressure sensitive adhesive layer of vinyl acetate copolymer, the energy radiation curable pressure sensitive adhesive layer, before exposure to energy radiation, having an elastic modulus ranging from $4.0 \times 10^4$ to $5.0 \times 10^6$ Pa at 50° C. The use of this pressure sensitive adhesive sheet for wafer sticking enables inhibiting the vibration of wafer at the time of dicing of the wafer so that chipping of the wafer can be minimized.

2 Claims, No Drawings

PRESSURE SENSITIVE ADHESIVE SHEET FOR WAFER STICKING

FIELD OF THE INVENTION

The present invention relates to a pressure sensitive adhesive sheet for wafer sticking. More particularly, the present invention is concerned with a pressure sensitive adhesive sheet for wafer sticking which is used to fix a wafer having circuits printed thereon at the time of dicing the wafer by each circuit.

BACKGROUND OF THE INVENTION

A semiconductor wafer of, for example, silicon or gallium arsenide is produced in a large diameter, cut and separated (diced) into elemental chips and subjected to the subsequent mounting step. In this process, the semiconductor wafer, in the state of being stuck to a pressure sensitive adhesive sheet (dicing sheet), undergoes the steps of dicing, washing, drying, expanding, pickup and mounting.

In the steps from dicing to pickup for the semiconductor wafer, it is common practice to use a pressure sensitive adhesive sheet comprising a base and, superimposed thereon, a pressure sensitive adhesive. In this pressure sensitive adhesive sheet, a base composed of a relatively soft resin is employed taking an expansibility into account, and a pressure sensitive adhesive with a relatively low elastic modulus is employed taking a stickiness into account.

For example, a polyvinyl chloride base containing a plasticizer is known as such a soft base. The polyvinyl chloride base containing a plasticizer is soft, exhibits high stiffness, is excellent in processability and is available at low cost. Therefore, the polyvinyl chloride base containing a plasticizer is used in various fields. However, in the pressure sensitive adhesive sheet including this type of base, the plasticizer may migrate into the pressure sensitive adhesive layer to thereby cause the pressure sensitive adhesive performance to deteriorate with the passage of. As a result, the pressure sensitive adhesive may be softened and no longer strippable to thereby invite the danger of staining the adherend. Accordingly, in the field of semiconductor processing wherein especially strict process control is required, the use of the polyvinyl chloride base containing a plasticizer may be refrained from, and, for example, a polyolefin film may be employed in place thereof. However, the pressure sensitive adhesive sheet for wafer sticking including the polyvinyl chloride base containing a plasticizer is highly attractive from the viewpoint that, due to its excellent processability, it is applicable to processing under widely varied conditions in even when a little variety of pressure sensitive adhesive sheet is used.

On the other hand, the pressure sensitive adhesive sheet including a pressure sensitive adhesive with a relatively low elastic modulus, although excellent in stickiness, cannot suppress minute vibrations of the wafer at the time of dicing of the wafer. Thus, the wafer may suffer from breakage (chipping) at the cut face thereof. This breakage, if extensive, may result in the damaging of circuits per se. Even if minute, the breakage may invite the danger of causing the final package to crack with the passage of time.

The present invention has been made in view of the above state of the prior art. Therefore, it is an object of the present invention to provide a pressure sensitive adhesive sheet for wafer sticking which can inhibit the vibration of the wafer at the time of dicing of the wafer so that chipping of the wafer can be minimized.

SUMMARY OF THE INVENTION

The pressure sensitive adhesive sheet for wafer sticking according to the present invention comprises a base of polyvinyl chloride containing a plasticizer and, superimposed thereon, an energy radiation curable pressure sensitive adhesive layer, wherein the energy radiation curable pressure sensitive adhesive layer, before exposure to energy radiation (or energy beams, or energy rays), has an elastic modulus ranging from $4.0 \times 10^4$ to $5.0 \times 10^6$ Pa at 50° C.

In the present invention, it is preferred that the energy radiation curable pressure sensitive adhesive layer comprise a vinyl ester copolymer and/or an acrylic copolymer having a glass transition temperature of 0 to 40° C.

The pressure sensitive adhesive sheet for wafer sticking according to the present invention preferably has an adhesive strength to mirror-finished stainless steel plate of at least 1000 mN/25 mm before exposure to energy radiation and an adhesive strength to mirror-finished stainless steel plate of 50 to 1000 mN/25 mm after exposure to energy radiation.

DETAILED DESCRIPTION OF THE INVENTION

The present invention will be described in detail below.

The pressure sensitive adhesive sheet for wafer sticking according to the present invention comprises a base of polyvinyl chloride containing a plasticizer and, superimposed thereon, an energy radiation curable pressure sensitive adhesive layer.

The base is composed mainly of a widely interpreted polyvinyl chloride resin, such as polyvinyl chloride, polyvinylidene chloride or a vinyl chloride copolymer. Preferably, the base is composed mainly of polyvinyl chloride.

A plasticizer is contained in the polyvinyl chloride resin. It is preferred that the plasticizer be contained in an amount, in terms of DOP, of 25 to 50 parts by weight, especially 30 to 45 parts by weight, per 100 parts by weight of polyvinyl chloride resin. The terminology "amount in terms of DOP" used herein means the amount corresponding to the amount of common plasticizer dioctyl phthalate (DOP) added to attain given properties. The plasticizer is not particularly limited, and can be, for example, any of phthalic acid ester plasticizers such as dioctyl phthalate, phosphoric acid ester plasticizers and polyester plasticizers.

The base composed of the polyvinyl chloride resin containing the above plasticizer is excellent in strength (stiffness), processability, elongation ratio, breaking strength and expansibility.

The thickness of the base, although not particularly limited, preferably ranges from about 50 to 200 μm, still preferably from about 70 to 150 μm. According to necessity, the base may be compounded with additives such as a filler, a stabilizer, an antistatic agent and a colorant.

The base side of the pressure sensitive adhesive sheet for wafer sticking according to the present invention is exposed to energy radiation after the completion of the dicing step. When ultraviolet light is used as the energy radiation, the base must be transparent.

The energy radiation curable pressure sensitive adhesive layer superimposed on the base comprises a polymer component and an energy radiation curable component as principal components thereof.

The energy radiation curable pressure sensitive adhesive layer, before exposure to energy radiation has an elastic modulus ranging from $4.0 \times 10^4$ to $5.0 \times 10^6$ Pa, preferably $5.0 \times 10^4$ to $5.0 \times 10^6$ Pa, at 50° C.

Generally, at the time of wafer dicing, frictional heat is generated, so that the temperature of the pressure sensitive adhesive layer is raised to about 50° C. When the elastic modulus at 50° C. falls within the above range, the transmission of vibration generated at the time of dicing from the pressure sensitive adhesive layer to the wafer is suppressed to thereby enable stably holding the wafer and hence enable reducing the occurrence of chipping. Even if the pressure sensitive adhesive layer has a high elastic modulus at temperatures lower than 50° C., the effect of reducing the occurrence of chipping cannot be expected when the elastic modulus at 50° C. is smaller than the above range.

As long as the energy radiation curable pressure sensitive adhesive layer satisfies the above requirement, various polymer components can be used as a main material thereof. For example, use can be made of polymer components such as vinyl ester copolymers, acrylic copolymers, rubber pressure sensitive adhesives and silicone pressure sensitive adhesives. Also, use can be made of mixtures and composites thereof. Further, for example, use can be made of copolymers of a vinyl ester monomer and an acrylic ester monomer.

In the present invention, polymer components having a glass transition temperature (Tg) of 0 to 40° C., especially 0 to 20° C., are suitable. Therefore, vinyl ester copolymers, acrylic copolymers and copolymers of a vinyl ester monomer and an acrylic ester monomer are preferably employed because the Tg thereof can appropriately be set through selection of monomer.

Examples of the vinyl ester monomer include vinyl acetate, vinyl butyrate, vinyl cinnamate and vinyl benzoate.

Examples of the acrylic ester monomer include methyl (meth)acrylate, ethyl (meth)acrylate, butyl (meth)acrylate and 2-ethylhexyl (meth)acrylate.

According to necessity, a monomer such as acrylic acid, methacrylic acid, itaconic acid, hydroxyethyl (meth)acrylate, hydroxypropyl (meth)acrylate, dimethylaminoethyl (meth)acrylate, acrylamide, methylolacrylamide or glycidyl methacrylate is appropriately used in the copolymerization as a crosslinking component.

Further, acrylonitrile, styrene or the like may be used in the copolymerization.

Using the copolymer composed mainly of vinyl acetate among the above monomers is especially preferred.

The regulation of Tg of polymer components can be accomplished by appropriately selecting the type and amount of monomer to be copolymerized.

Specifically, the Tg of vinyl ester polymer or acrylic ester polymer can be estimated from the Tg of homopolymer of selected monomer and the weight ratio of the selected monomer by the formula:

$$\frac{1}{Tg} = \frac{W_1}{Tg_1} + \frac{W_2}{Tg_2} \cdots + \frac{W_n}{Tg_n}$$

wherein $W_n$: weight ratio of monomer n, and $Tg_n$: glass transition temperature (unit: K) of homopolymer of monomer n.

Thus, the attainment of relatively high Tg can be accomplished by increasing the compounding ratio of monomer capable of forming a homopolymer of high Tg.

In the present invention, it is especially desirable to employ a polymer component wherein structural units derived from a monomer containing a functional group capable of forming a hydrogen bond, such as carboxyl of acrylic acid or methacrylic acid, are contained in an amount of 0.01 to 5 parts by weight, preferably 0.1 to 4 parts by weight, per 100 parts by weight of polymer component.

The above monomer containing a functional group capable of forming a hydrogen bond forms a homopolymer of high Tg value, so that the Tg of the polymer component can be easily controlled. However, the migration of plasticizer from the base would break the hydrogen bond formed in the polymer to thereby invite the danger of lowering the elastic modulus of the pressure sensitive adhesive layer.

When the amount of structural units derived from the monomer containing a functional group capable of forming a hydrogen bond is extremely small, the pressure sensitive adhesive layer cannot be satisfactorily crosslinked to thereby disenable increasing the elastic modulus of the pressure sensitive adhesive layer.

In the present invention, it is suitable to employ a polymer component containing 10 to 90 parts by weight, preferably 50 to 90 parts by weight, of structural units derived from vinyl acetate per 100 parts by weight of polymer component.

As apparent from the above, the Tg of the polymer component can be regulated by appropriately selecting the type and amount of monomer for constituting the polymer component to thereby enable ultimately regulating the elastic modulus (at 50° C.) of the energy radiation curable pressure sensitive adhesive layer so as to fall within the desired range. Satisfactory tackiness can be imparted to the pressure sensitive adhesive layer composed mainly of the polymer component having Tg of 0 to 40° C. by appropriately adding the following energy radiation polymerizable component and tackifier resin.

The pressure sensitive adhesive sheet for wafer sticking in which use is made of the above polymer component is excellent in shelf life, is free from deterioration of pressure sensitive adhesive properties with the passage of time and does not stain adherends.

The energy radiation curable pressure sensitive adhesive layer of the pressure sensitive adhesive sheet for wafer sticking according to the present invention comprises the above polymer component and an energy radiation polymerizable component as principal components.

For example, low-molecular-weight compounds having in the molecule thereof at least two photopolymerizable carbon to carbon double bonds that can form a three-dimensional network structure by light irradiation as disclosed in Japanese Patent Laid-open Publication Nos. 60(1985)-196,956 and 60(1985)-223,139 are widely used as the energy radiation polymerizable component. Specific examples thereof include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylates.

In addition to the above acrylate compounds, urethane acrylate oligomers can be used as the energy radiation polymerizable components. Urethane acrylate oligomers can be obtained by reacting a polyester or polyether type polyol compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate to thereby obtain an isocyanate-terminal urethane prepolymer and by reacting this isocyanate-terminal urethane prepolymer with a hydroxyl group containing acrylate or methacrylate, such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate. These energy radiation polymerizable components are flowable at room temperature and can complement the polymer component of 0 to 40° C. glass transition temperature with tackiness.

With respect to the blending ratio of the energy radiation polymerizable component to the polymer component in the energy radiation curable pressure sensitive adhesive, it is preferred that 50 to 200 parts by weight, especially 50 to 150 parts by weight, and still especially 60 to 140 parts by weight, of the energy radiation polymerizable component be used per 100 parts by weight of the polymer component. In this instance, the initial adhesive strength of the obtained pressure sensitive adhesive sheet is large, and the adhesive strength is sharply dropped upon exposure to energy radiation. Accordingly, the peeling at the interface of the chips and the energy radiation curable pressure sensitive adhesive layer to be performed after the completion of wafer dicing is facilitated.

The time spent for photopolymerization and the photoirradiation dose can be reduced by mixing a photopolymerization initiator into the energy radiation curable pressure sensitive adhesive.

Examples of the photopolymerization initiator include a photoinitiator such as a benzoin compound, an acetophenone compound, an acylphosphine oxide compound, a titanocene compound, a thioxanthone compound or a peroxide compound, or a photosensitizer such as an amine or a quinone. Specific examples thereof include 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl and β-chloroanthraquinone.

The photopolymerization initiator is preferably added in an amount of 0.05 to 15 parts by weight, still preferably 0.1 to 10 parts by weight, and optimally 0.5 to 5 parts by weight, to 100 parts by weight of the total of pressure sensitive adhesive.

The pressure sensitive adhesive layer may be loaded with a tackifier resin in order to maintain the balance of adhesive strength and cohesive strength before and after the exposure to energy radiation. The tackifier resin can be, for example, any of an aliphatic/aromatic copolymer petroleum resin, an aliphatic petroleum resin, an aromatic petroleum resin, an aliphatic hydrocarbon resin, a rosin resin, a rosin ester resin, a rosin polyol resin, a rosin acrylate resin, a terpene resin, a terpene phenol resin, a phenol resin, a xylene resin, a coumarone resin, a coumarone-indene resin and a styrene resin, or any of modification products, derivatives and hydrogenation products thereof. These may be used either individually or in combination. Loading with a liquid tackifier having a softening point of up to room temperature enables complementing the polymer component of 0 to 40° C. glass transition temperature with tackiness.

The tackifier resin is preferably used in an amount of 0 to 50 parts by weight per 100 parts by weight of polymer component. That is, the amount is selected so that the adhesive strength before and after exposure to energy radiation falls within the above range.

The above energy radiation curable pressure sensitive adhesive possesses satisfactory adhesive strength to the wafer before exposure to energy radiation, and the adhesive strength is extremely reduce upon exposure to energy radiation. That is, the energy radiation curable pressure sensitive adhesive enables bonding the wafer and the pressure sensitive adhesive sheet and satisfactory adhesive strength to thereby attain fixing of the wafer before exposure to energy radiation, but, after exposure to energy radiation, permits easily stripping the pressure sensitive adhesive sheet from the wafer diced into chips.

A crosslinking agent is added to the energy radiation curable pressure sensitive adhesive in order to increase the elastic modulus of the energy radiation curable pressure sensitive adhesive and to cause it to have satisfactory cohesive strength. The crosslinking agent converts the polymer component into a three-dimensional crosslink structure to thereby impart satisfactory elastic modulus and cohesive strength thereto. Common crosslinking agents such as polyisocyanate compounds, polyepoxy compounds, polyaziridine compounds and chelate compounds can be used. Examples of the polyisocyanate compounds include toluylene diisocyanate, diphenylmethane diisocyanate, hexamethylene diisocyanate, isophorone diisocyanate and adducts of these polyisocyanates and polyhydric alcohols. Examples of the polyepoxy compounds include ethylene glycol diglycidyl ether and diglycidyl terephthalate acrylate. Examples of the polyaziridine compounds include tris-2,4,6-(1-aziridinyl)-1,3,5-triazine and tris[1-(2-methyl)aziridinyl]triphosphatotriazine. Examples of the chelate compounds include ethylacetoacetatoaluminum diisopropylate and aluminum tris(ethylacetoacetate). These compounds can be used either individually or in combination.

The crosslinking agent is preferably added in an amount of 0.01 to 20 parts by weight, still preferably 0.1 to 10 parts by weight, per 100 parts by weight of polymer component.

The energy radiation curable pressure sensitive adhesive for use in the present invention is produced by appropriately mixing together the above components and adding other components if desired.

The adhesive strength, exhibited by 180° peeling, to mirror-finished stainless steel plate (SUS304) of the energy radiation curable pressure sensitive adhesive before exposure to energy radiation is at least 1000 mN/25 mm, preferably in the range of 1000 to 2000 mN/25 mm. On the other hand, the adhesive strength of the energy radiation curable pressure sensitive adhesive after exposure to energy radiation is in the range of 50 to 1000 mN/25 mm, preferably 60 to 800 mN/25 mm. The polymer component per se does not exhibit any adhesive strength. The energy radiation curable pressure sensitive adhesive possessing the above properties can be obtained by combining the polymer component with the energy radiation polymerizable component and tackifier resin.

The thickness of the energy radiation curable pressure sensitive adhesive layer, although not particularly limited, is preferably in the range of about 5 to 40 μm.

The pressure sensitive adhesive sheet for wafer sticking according to the present invention comprises the pressure sensitive adhesive layer composed of the above energy radiation curable pressure sensitive adhesive and the polyvinyl chloride base containing the plasticizer.

The pressure sensitive adhesive sheet for wafer sticking of the present invention can be obtained by coating the above base with the above energy radiation curable pressure sensitive adhesive at an appropriate thickness according to the customary technique employing a roll coater, a knife coater, a gravure coater, a die coater, a reverse coater or the like, followed by drying. After the production, when considered necessary, a release liner may be applied onto the energy radiation curable pressure sensitive adhesive layer in order to protect the layer.

The method of using the pressure sensitive adhesive sheet for wafer sticking according to the present invention will now be briefly described.

When the release liner is applied on the pressure sensitive adhesive sheet, the release liner is removed. Subsequently, the pressure sensitive adhesive sheet is placed with the pressure sensitive adhesive layer upward, and a semiconductor wafer to be diced is stuck to the upper surface of the pressure sensitive adhesive layer. The wafer in the state of being stuck to the pressure sensitive adhesive sheet is diced, washed and dried. During these steps, the wafer chips are secured with satisfactory adhesive strength to the pressure sensitive adhesive sheet by means of the pressure sensitive adhesive layer, so that the wafer chips are not dropped off. Further, because the wafer chips are secured with satisfactory adhesive strength, chipping can be inhibited.

Thereafter, the individual wafer chips are picked up from the pressure sensitive adhesive sheet and mounted on a given substrate. Before or during the pickup, the pressure sensitive adhesive layer of the pressure sensitive adhesive sheet is exposed to energy radiation such as ultraviolet light or electron beams so that the energy radiation polymerizable component contained in the pressure sensitive adhesive layer is polymerized and cured. The polymerization and curing of the energy radiation polymerizable component by the exposure of the pressure sensitive adhesive layer to energy radiation causes the adhesive strength of the pressure sensitive adhesive layer to significantly decrease with the result that only slight adhesive strength remains.

The exposure of the pressure sensitive adhesive sheet to energy radiation is preferably performed on the side of the base not furnished with the pressure sensitive adhesive layer. Thus, as aforementioned, when ultraviolet light is employed as the energy radiation, the base must be photopermeable. However, when electron beams are employed as the energy radiation, it is not always necessary to employ a photopermeable base.

Thereafter, according to necessity, the pressure sensitive adhesive sheet after exposure is expanded to thereby enlarge the chip spacing. The required extent of expansion, although depending on the type of expanding equipment and pickup equipment, is satisfactory if it is about 80 μm in both the lengthwise and lateral directions. If the extent of expansion is such, the steps can proceed to the next one without any problem. After the expansion, the individual chips are picked up with the use of pickup equipment such as a suction collet and mounted on a given substrate.

The present invention as described above provides a pressure sensitive adhesive sheet for wafer sticking which can inhibit the vibration of wafer at the time of dicing of the wafer so that chipping of the wafer can be minimized.

EXAMPLE

The present invention will further be illustrated below with reference to the following Examples which in no way limit the scope of the invention.

In the following Examples and Comparative Examples, the "elastic modulus at 50° C.", "glass transition temperature", "chipping", "adhesive strength before and after exposure to energy radiation", "expansibility" and "chip alignment" were evaluated in the following manner.

"Elastic Modulus at 50° C."

The elastic modulus (Pa) at 50° C. of pressure sensitive adhesive was measured by the torsional shearing method:

test piece: cylindrical piece of 8 mm diameter and 3 mm height, measuring instrument: Dynamic Analyzer RDA II (manufactured by Rheometrics, Inc.), and frequency: 1 Hz.

"Glass Transition Temperature"

The glass transition temperature was calculated by the formula:

$$\frac{1}{Tg} = \frac{W_1}{Tg_1} + \frac{W_2}{Tg_2} \cdots + \frac{W_n}{Tg_n}$$

wherein $W_n$: weight ratio of monomer n, and $Tg_n$: glass transition temperature (unit: K) of homopolymer of monomer n.

The glass transition temperatures of principal homopolymers were as follows:

vinyl acetate homopolymer: 32° C. (305 K), homopolymer of 2-ethylhexyl acrylate: −70° C. (203 K), homopolymer of acrylic acid: 106° C. (379 K), homopolymer of hydroxyethyl methacrylate: 55° C. (328 K), homopolymer of butyl acrylate: −55° C. (218 K), and homopolymer of methyl methacrylate: 105° C. (378 K).

"Chipping Test"

A semiconductor wafer of 6 inch diameter having a circuit pattern formed thereon was stuck to each of the pressure sensitive adhesive sheets of the Examples and Comparative Examples, secured to a ring frame and subjected to 3.8 mm×3.7 mm full cut performed with the use of dicing equipment (AWD-4000B manufactured by Tokyo Seimitsu Co., Ltd., including dicing blade 27HECC manufactured by Disco Corporation) under such conditions that the blade feed speed was 70 mm/sec, the rotating speed 30,000 rpm, and the depth of cut into the pressure sensitive adhesive sheet 25 μm.

The back of each of thus obtained 50 chips was observed through an optical microscope. The chips suffering from 70 μm or greater chipping were graded as "bad".

"Adhesive Strength Before and After Exposure to Energy Radiation"

Each of the pressure sensitive adhesive sheets produced in the Examples and Comparative Examples was stuck to a mirror-finished stainless steel plate (SUS304) in an atmosphere of 23° C. and 65% RH by reciprocating a rubber roller of 2 kg and allowed to stand still for 20 min. Thereafter, 180° peel adhesive strength (mN/25 mm) was measured at a peel speed of 300 mm/min by the use of universal tensile tester (trade name: TENSILON/UTM-4-100, manufactured by Orientec Corporation) in accordance with Japanese Industrial Standard Z0237.

Also, the sticking of the pressure sensitive adhesive sheet was performed in the same manner, and the base side of the pressure sensitive adhesive sheet was exposed to ultraviolet light (using Adwill RAD2000 m/8 manufactured by Lintec Corporation, at an illumination intensity of 400 mJ/cm$^2$ and a quantity of light of 250 mW/cm$^2$)). The adhesive strength after the exposure to ultraviolet light was measured in the above manner.

"Expansibility"

A 6-inch wafer was stuck to each of the pressure sensitive adhesive sheets produced in the Examples and Comparative Examples, and secured to ring frame (trade name: 2-6-1, manufactured by Disco Corporation). The same full cut as in the above chipping test was effected. At that time, the chip size was 15 mm-square. The pressure sensitive adhesive sheet was exposed to ultraviolet light in the same quantity of light as in the measurement of the adhesive strength after exposure to energy radiation, and expanded by 12 mm with the use of an expanding jig. With respect to six chips disposed at or around the center of the pressure sensitive adhesive sheet, the chip spacings were measured in both the lengthwise and lateral directions. The pressure sensitive adhesive sheet causing the chips to have spacings of less than 80 μm in the lengthwise or lateral direction was graded as "bad", while the pressure sensitive adhesive sheet causing all the chip spacings to be 80 μm or more in both the lengthwise and lateral directions was graded as "good".

"Chip Alignment"

After the above expansion, the chip alignment wherein the chip spacings were extremely different from each other according to locations or wherein chip drift occurred was graded as "bad", while the chip alignment wherein the chip spacing was found to be uniform by visual inspection was graded as "good".

Employed polymer components, energy radiation polymerizable components and other components were as follows:

A "Polymer Components" (Glass Transition Temperature of Homopolymer Indicated in the Parentheses)

A1: copolymer of vinyl acetate (305 K), 2-ethylhexyl acrylate (203 K) and hydroxyethyl methacrylate (328 K) (ratio of 80:19.5:0.5, weight average molecular weight=170,000), A2: copolymer of vinyl acetate (305 K), 2-ethylhexyl acrylate (203 K), hydroxyethyl methacrylate (328 K) and acrylic acid (379 K) (ratio of 80:18.5:0.5:1, weight average molecular weight=170,000), and A3: copolymer of butyl acrylate (218 K) and acrylic acid (379 K) (ratio of 91:9, weight average molecular weight=400,000);

B "Energy Radiation Polymerizable Component"

B1: 1:1 mixture of hexa-functional urethane acrylate (weight average molecular weight=1500) and bi-functional urethane acrylate (weight average molecular weight=11,000), and B2: tri-functional urethane acrylate (weight average molecular weight=3500);

C "Photopolymerization Initiator"

C1: 2,2-dimethoxy-1,2-diphenylethan-1-one, and

C2: 1-hydroxycyclohexyl phenyl ketone;

D "Crosslinking Agent"

D1: adduct of toluylene diisocyanate and trimethylolpropane; and

E "Tackifier"

E1: terpene phenol copolymer (softening point 125° C.),

E2: aliphatic/aromatic copolymer petroleum resin (softening point 100° C.), and

E3: rosin polyol (molecular weight 2700 (liquid)).

Example 1

An energy radiation curable pressure sensitive adhesive was obtained by mixing together the components indicated in Table 1 at the proportion indicated in Table 1. A base (80 μm thick polyvinyl chloride film containing 34 parts by weight of DOP per 100 parts by weight of polyvinyl chloride resin) was coated with the obtained pressure sensitive adhesive, thereby obtaining a pressure sensitive adhesive sheet for wafer sticking having a 10 μm thick energy radiation curable pressure sensitive adhesive layer.

The results are given in Table 2.

Examples 2–3 and Comparative Examples 1–3

Energy radiation curable pressure sensitive adhesives were obtained by mixing together the components indicated in Table 1 at the proportion indicated in Table 1. The same procedure as in Example 1 was repeated except that these pressure sensitive adhesives were employed.

The results are given in Table 2.

TABLE 1

Energy radiation curable pressure sensitive adhesive layer (pts. wt.)

|  | polymer component A | energy radiation polymerizable component B | photopolymerization initiator C (content per 100 pts. wt. of pressure sensitive adhesive (A–E) | crosslinking agent D | tackifier E |
|---|---|---|---|---|---|
| Example 1 | A1: 100 | B1: 69 | C1: 3.4 | D1: 6 | E1: 5 |
| 2 | A2: 100 | B1: 69 | C1: 3.4 | D1: 3 | E2: 5 |
| 3 | A2: 100 | B1: 69 | C1: 3.4 | D1: 3 | E3: 5 |
| Comp. Ex. 1 | A2: 100 | B1: 143 | C1: 5.0 | D1: 3 | E1: 5 |
| 2 | A2: 100 | B1: 69 | C1: 3.4 | D1: 3 | E3: 10 |
| 3 | A3: 100 | B2: 176 | C2: 2.6 | D1: 11 |  |

TABLE 2

| | Evaluation results | | | | | | |
|---|---|---|---|---|---|---|---|
| | | | adhesive strength (mN/25 mm) | | | | |
| | elastic modulus (Pa) at 50° C. | glass transition temp. of polymer component (° C.) | before exposure to energy radiation | after exposure to energy radiation | chip cracking ratio (%) | expansibility | chip alignment |
| Example 1 | $9.0 \times 10^4$ | 5 | 1270 | 90 | 3 | good | good |
| Example 2 | $9.5 \times 10^4$ | 7 | 3230 | 300 | 0 | good | good |
| Example 3 | $1.1 \times 10^5$ | 7 | 3830 | 250 | 0 | good | good |
| Comp. Ex. 1 | $2.5 \times 10^4$ | 7 | 15000 | 400 | 40 | good | bad |
| Comp. Ex. 2 | $3.8 \times 10^4$ | 7 | 5880 | 100 | 35 | good | bad |
| Comp. Ex. 3 | $2.1 \times 10^4$ | −46 | 3920 | 390 | 40 | good | bad |

What is claimed is:

1. A pressure sensitive adhesive sheet for wafer sticking, comprising a base of polyvinyl chloride containing a plasticizer and, superimposed thereon, an energy radiation curable pressure sensitive adhesive layer, wherein the energy radiation curable pressure sensitive adhesive layer, before exposure to energy radiation, has an elastic modulus ranging from $4.0 \times 10^4$ to $5.0 \times 10^6$ Pa at 50° C., and comprises a vinyl ester copolymer containing 50 to 90 parts by weight of structural units derived from vinyl acetate per 100 parts by weight of polymer component and having a glass transition temperature of 0 to 400° C.

2. The pressure sensitive adhesive sheet for wafer sticking as claimed in claim 1, which has an adhesive strength to mirror-finished stainless steel plate of at least 1000 mN/25 mm before exposure to energy radiation and an adhesive strength to mirror-finished stainless steel plate of 50 to 1000 mN/25 mm after exposure to energy radiation.

* * * * *

UNITED STATES PATENT AND TRADEMARK OFFICE
CERTIFICATE OF CORRECTION

PATENT NO.     : 6,524,700 B2
DATED          : February 25, 2003
INVENTOR(S)    : Yasushi Masuda et al.

It is certified that error appears in the above-identified patent and that said Letters Patent is hereby corrected as shown below:

Column 1,
Line 38, "passage of." should read -- passage of time.--
Line 51, "in even when" should read -- even when --.

Column 3,
Line 30, "selection of monomer" should read -- selection of the monomer --.

Column 5,
Line 67, "extremely reduce" should read -- extremely reduced --.

Column 12,
Line 20, "400ºC" should read -- 40ºC --.

Signed and Sealed this

Nineteenth Day of August, 2003

JAMES E. ROGAN
*Director of the United States Patent and Trademark Office*